United States Patent
Huang et al.

(10) Patent No.: US 10,386,391 B2
(45) Date of Patent: Aug. 20, 2019

(54) METHOD FOR SIMULTANEOUS MONITORING OF PHASE CURRENT AND SPATIAL PARAMETERS OF OVERHEAD TRANSMISSION LINES WITH NON-CONTACT MAGNETIC FIELD SENSOR ARRAY

(71) Applicant: University of Electronic Science and Technology of China, Chengdu, Sichuan (CN)

(72) Inventors: Qi Huang, Chengdu (CN); Arsalan Habib Khawaja, Rawalpindi (PK); Ai Zheng, Chengdu (CN); Shi Jing, Chengdu (CN); Jian Li, Chengdu (CN); Zhenyuan Zhang, Chengdu (CN); Jianbo Yi, Chengdu (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 53 days.

(21) Appl. No.: 15/462,831

(22) Filed: Mar. 18, 2017

(65) Prior Publication Data
US 2018/0143224 A1 May 24, 2018

(30) Foreign Application Priority Data
Nov. 21, 2016 (CN) .......................... 2016 1 1039215

(51) Int. Cl.
*G01R 15/14* (2006.01)
*G01R 19/25* (2006.01)

(52) U.S. Cl.
CPC ........ *G01R 15/148* (2013.01); *G01R 19/2513* (2013.01)

(58) Field of Classification Search
CPC ........ G01D 5/14; G01R 15/20; G01R 15/148; G01R 19/2513
See application file for complete search history.

(56) References Cited

U.S. PATENT DOCUMENTS

| 9,768,888 B2 * | 9/2017 | Li ........................ G01N 29/041 |
| 2014/0028463 A1 * | 1/2014 | Chamarti ............... G01D 4/002 |
| | | 340/870.02 |

OTHER PUBLICATIONS

Sun et al, Noncontact Operation-State Monitoring Technology Based on Magnetic-Field Sensing for Overhead High-Voltage Transmission Lines, IEEE Transactions on Power Delivery, vol. 28. No. 4, Oct. 2013, pp. 2145-2153.*

* cited by examiner

*Primary Examiner* — Bryan Bui
(74) *Attorney, Agent, or Firm* — Michael D. Eisenberg

(57) ABSTRACT

The invention discloses a monitoring system for estimation of phase conductor parameters of overhead high voltage transmission lines. Particularly, these parameters include electric current, conductor clearance from ground and wind induced conductor motion. This is realized by utilizing magnetic field sensing at various points or of various components with state of art Tunnel Magneto resistive sensors. The measured data is then divided into two groups, where one group performs the reconstruction using magnetic field and the other group validates the reconstructed results. For each group, initial conductor to sensor position coefficients are stored in two different sensitivity matrices in memory. For a change in conductor spatial position, the sensitivity matrices are altered which is estimated for each group and then validated by comparison. Errors in the reconstruction process are minimized by sensor placement at optimal points which ensures the condition number remains close to unity.

9 Claims, 3 Drawing Sheets

METHOD FOR SIMULTANEOUS MONITORING OF PHASE CURRENT AND SPATIAL PARAMETERS OF OVERHEAD TRANSMISSION LINES WITH NON-CONTACT MAGNETIC FIELD SENSOR ARRAY

CROSS-REFERENCES TO RELATED APPLICATIONS

The present application claims priority to Chinese Patent Application No. 201611039215.X, filed Nov. 21, 2016, which is hereby incorporated herein by reference in its entirety.

TECHNICAL FIELD OF THE INVENTION

The present invention relates to the field of overhead transmission line monitoring, more particularly to a method for simultaneous monitoring phase current and spatial parameters of overhead transmission lines non-contact magnetic field sensor array. Particularly, the apparatus estimates the phase current, individual conductor clearance from ground, and wind induced conductor motion. This is achieved by utilizing measurements from magnetic field sensor, which can be mounted on support towers or arranged in a portable device, close to each of the conductors. The invention also describes a method to determine the optimal positioning of sensing units.

BACKGROUND OF THE INVENTION

During recent years, traditional power grids have emerged as smart grids. Many aspects of future smart grids are defined in the SG3 standardization roadmap prepared by International Electro Technical Commission. The roadmap declares an efficient transmission and distribution network as one prime driver of a smart grid. It also urges the development of a stable communication link between various components of a power grid, which will enable overall grid monitoring and rapid troubleshooting at central control stations.

Overhead high voltage transmission lines are a vital mode of transportation of power for widely distributed transmission network. The overhead lines serve to connect generation units to distribution sites via high voltage transmission lines terminating at substations, and to connect generation units to end users via relatively low voltage distributed lines.

The overhead lines remain exposed to extreme conditions due to long distance transmission. Such exposure commonly results in reduction of ground clearance, in the form of conductor elongation (sag). Another effect of extreme weather is wind-induced conductor motion, referred to as Aeolian vibration and conductor galloping. Outdoor conditions are not only limited to environmental factors, but may also include line faults. Altogether, this hinders the efficient operation of the power grid, and may result in permanent damage to the network. Thus, a timely estimate of phase current, conductor elongation, and wind-induced motion can dramatically improve security of power grid and reduce outage times.

During recent years, many researchers have proposed methods for operation for state monitoring of overhead transmission lines. The methods involve both contact and non-contact based retrieval of spatial parameters and line current. In industry, non-contact measurement products such as Sagometer by Engineering Data Management have been recently commercialized, which measures sag in transmission lines using a camera as a sensor, and digital Image processing techniques. Another device is developed by Electric Research Power Institute which needs to be attached with live current carrying conductors to monitor conductor temperature, sag, current and vibration, as descripted in A. Phillips, "Evaluation of Instrumentation and Dynamic Thermal Ratings for Overhead Lines," Electric Power Research Institute, Palo Alto, Calif., Tech, Rep., October 2013, in research, a group proposed the use of non-contact magnetic field sensors for estimation of spatial and electrical parameters of transmission line, as descripted in X. Sun, Q. Huang, Y. Hou, L. Jiang and P. W. T. Pong, "Noncontact Operation-State Monitoring Technology Based on Magnetic-Field Sensing for Overhead High-Voltage Transmission Lines," in IEEE Transactions on Power Delivery, vol. 28, no. 4, pp. 2145-2153, October 2013. However, the method involves using a large number of sensing units, and computational expensive stochastic optimization techniques, which restrict the practical utilization of the approach.

A device disclosed in U.S. patent application publication no. 20120046799 has been presented which needs to be attached to the conductor and monitors temperature, inclination, voltage and current. The device includes a complete platform for instrumentation to send the measurements to the base station. However, the contact-based nature of the device limits its portability and incurs huge setup and maintenance costs.

An apparatus utilizing non-contact magnetic field sensing coils and a computerized method has been disclosed under U.S. Pat. No. 8,280,652. The device makes use of magnetic field measurements to calculate the distance between conductor and sensing elements, and then utilize the calculated distance for current load estimation. A number of sensing coils are placed on ground surface measuring the horizontal and vertical components of magnetic field radiated from phase conductors. However, the method only accounts for the sensor to conductor distance, and does not address the conductor elongation in neighboring spans where the sensing elements are deployed.

The present invention aims to overcome the deficiencies of prior art by providing a method for monitoring phase current and spatial parameters of overhead transmission lines with noncontact magnetic field sensor array. It can provide real time load monitoring as well as obtain spatial information of phase conductor positions, in rest and motion.

BRIEF SUMMARY OF THE EMBODIMENTS OF THE INVENTION

Figure 1:
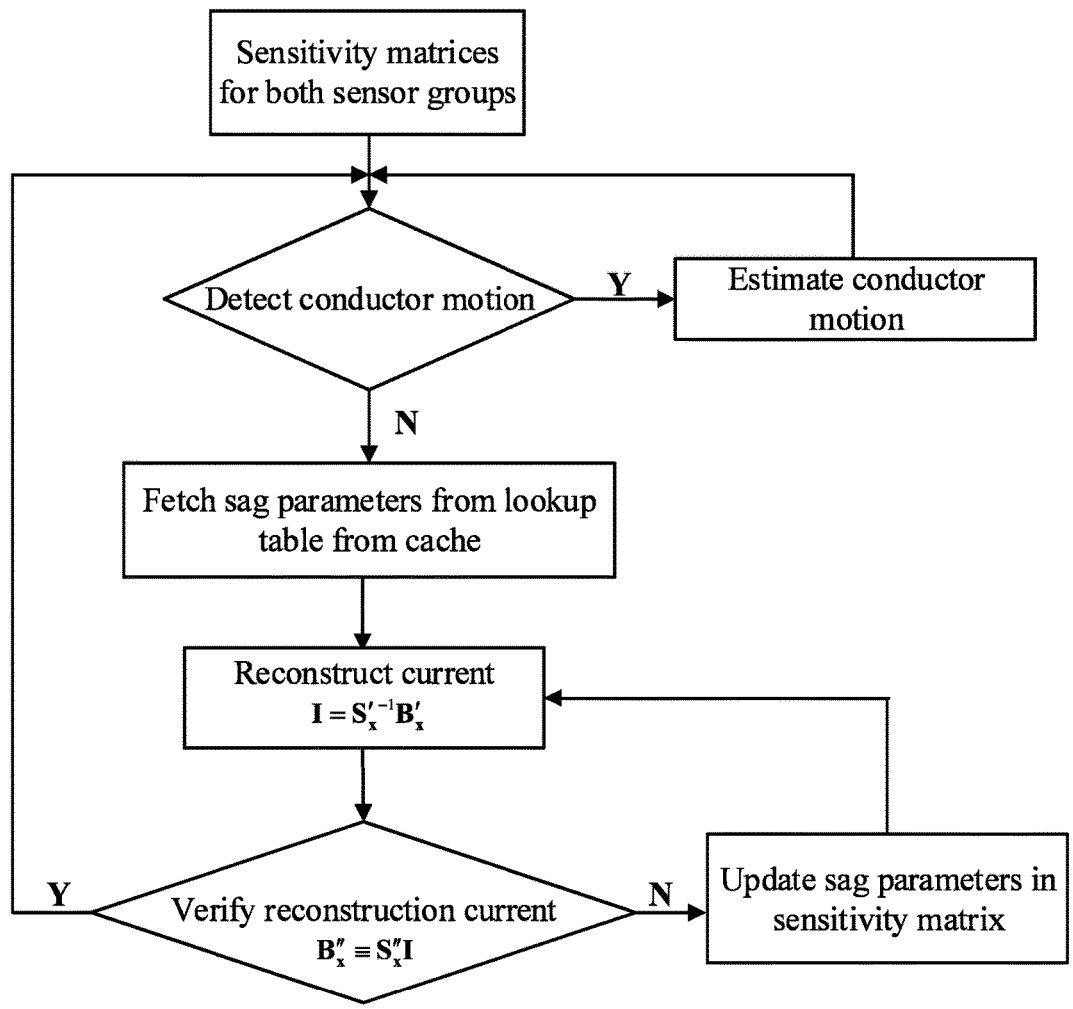
FIG. 1 depicts a functional block diagram of a method of the present invention.

In a variant, a method for simultaneous monitoring of phase current and spatial parameters of overhead transmission lines with a non-contact magnetic field sensor array, comprises calculating a sensitivity matrix; calculating optimal sensing points; and detecting conductor motion; and reconstructing a phase current and sag.

In another variant, reconstructing a phase current and sag comprises reading the initial or last saved sag of each of the phase conductors in a look up table; reconstructing the phase current utilizing data from one group of sensors to calculate phase current I:

$$I = S'^{-1}_x B'_x \text{ where,}$$

$$I = \begin{bmatrix} I_1 \\ \vdots \\ I_N \end{bmatrix},$$

$$B'_x = \begin{bmatrix} B'_{x_1} \\ \vdots \\ B'_{x_N} \end{bmatrix};$$

verifying a reconstructed phase current utilizing the sensitivity matrix from a look up table and data from a second group of sensors; verifying the equality $$B''_x = S''_x I \text{ where,}$$

$$B''_x = \begin{bmatrix} B''_{x_1} \\ \vdots \\ B''_{x_N} \end{bmatrix}$$

holds true by checking if the difference between both sides of equation is less than a small threshold value; and if the equality holds true, updating both the sensitivity matrices $S'_x$ and $S''_x$, communicating the sag and phase current reconstruction results. If the equality does not hold true, jumping to the next value from look up table and updating the sensitivity matrix; utilizing a new combination from the look up table of sag values to update the sensitivity matrix coefficients for both of the sensor groups; and repeating steps 2) and 3).

In a further variant, calculating sensitivity matrix comprises measuring one or two components of a magnetic field vector via sensors arranged in two groups, where each group consists of sensors sensitive along one component and equal to number of phase conductors.

In yet another variant, the sensors are only sensitive along a one axis, the total number of sensors will be twice in number as of the phase conductors.

In another variant, the method comprises calculating a sensitivity parameter which governs the relationship for the i-th sensor in a first group of sensors and the j-th phase conductor, wherein i is 1, 2, . . . , N, and j is 1, 2, . . . , N, where N denotes the quantity of phase conductors; wherein the sensitivity matrix of the first group of sensors is $S'_x=(A'_{ij})N \times N$ and the sensitivity matrix of the second group of sensors is) $S''_x=(A''_{ij})N \times N$, and storing the sensitivity matrices $S'_x$ and $S''_x$ in a memory.

In a further variant, detecting conductor motion comprises in a time interval t for measured magnetic field intensity by each of the sensors, if variations for any of the magnetic field sensor measurements during the adjacent cycles exceeds the sum of setting threshold, flags conductor motion; retrieving a motion characteristic; and repeating steps i) and ii) for the next time interval, until for all of the sensor measurements for an adjacent cycle peak rate is less than a set threshold.

In yet another variant, a method for simultaneous monitoring of phase current and spatial parameters of overhead transmission lines with a non-contact magnetic field sensor array, comprises sensors along an axis of a magnetic field; phase conductors attached to a support tower; a first group of sensors having a sensitivity parameter $A'_{ij}$ for a horizontal, vertical, or z-component based on adequate field strength along the respective axis; a second group of sensors having a sensitivity parameter $A''_{ij}$ for a horizontal, vertical, or z-component; wherein the sensitivity parameter of each horizontal, vertical, or z-component of a sensor in the first group is calculated to constitute a sensitivity matrix $S'_x=(A'_{ij})N \times N$ or $S'_y=(A'_{ij})N \times N$ or $S'_z=(A'_{ij})N \times N$; wherein the sensitivity parameter of each sensor in the second group is calculated to form a sensitivity matrix $S''_x=(A''_{ij})N \times N$ or $S''_y=(A''_{ij})N \times N$ or $S''_z=(A''_{ij})N \times N$; wherein the magnetic field is measured at each sensor during a time interval of t seconds; wherein a phase current I is calculated using data from the first group of sensors $I=S'^{-1}_x B'_x$ or $I=S'^{-1}_y B'_y$ or $I=S'^{-1}_y B'_y$; and wherein the phase current is verified by using a sensitivity matrix and data from the second group of sensors $B''_x=S''_x I$ or $B''_y=S''_y I$ or $B''_z=S''_z I$.

In another variant, a condition number is calculated for each sensitivity matrix.

In a further variant, the condition numbers close to unity specify the optimal placement points for sensors.

In yet another variant, amplitude, frequency, and trajectory of each phase conductor is calculated using the measured magnetic field at each sensor during the time interval t.

In another variant, calculations of the amplitude, frequency, and trajectory of each phase conductor are triggered by a detection of conductor motion.

In a further variant, the frequency of each phase conductor is the reciprocal of the time interval between a magnetic field intensity measured for a maximum energy cycle to a minimum energy cycle obtained by the closest sensor.

In yet another variant, the trajectory is measured by calculating a magnetic field strength for each conductor, calculating the coordinates of each conductor using $(x^r_j \leftarrow x^r_j (\theta_j+\Delta\theta_j), y^r_j \leftarrow y^r_j(\theta_j+\Delta\theta_j))$, and comparing the measured field strength to a calculated field $(B'_{x,calculated}(x^r_j, y^r_j) \equiv B''_{x,calculated}(x^r_j, y^r_j))$ or $(B'_{y,calculated}(x^r_j, y^r_j) \equiv B''_{y,calculated}(x^r_j, y^r_j))$ or $(B'_{z,calculated}(x^r_j, y^r_j) \equiv B''_{z,calculated}(x^r_j, y^r_j))$.

In another variant, the sensitive sensors are divided into two groups depending on a position of the sensors in relation to a position of the phase conductors.

In a further variant, i=1, 2, . . . , N, j=1, 2, . . . , N, and N is the number of phase conductors.

In yet another variant, the field strength varies with different support tower configurations and sensing directions.

In another variant, a number of sensors in each group equals a number of phase conductors.

In a further variant, the sensitivity matrix is stored in memory.

In yet another variant, conductor motion is detected if the magnetic field at sensors closest to conductors show a strong variation at adjacent cycle peak points.

In another variant, the magnetic field of each sensor can be determined along one to three components, including an x-axis, y-axis, and z-axis.

In a further variant, $B'_x$ or $B'_y$ or $B'_z$ is a matrix having magnetic field strength obtained from 1st to N sensors of the first group.

In yet another variant, $B''_x$ or $B''_y$ or $B''_z$ is magnetic field strength obtained from the second group of N magnetic field sensors.

In another variant, accessing a table of sag combinations for phase conductors.

In a further variant, both of the groups may contain magnetic field projections from the same component, or a combination of both depending upon the tower configuration.

In yet another variant, a monitoring system for estimation of phase conductor parameters of overhead high voltage transmission lines, comprises sensors; phase conductors; a support tower; a computing unit; an analog to digital converter; a processor; and a battery.

In another variant, signals from the sensors are received by the computing unit.

In a further variant, the analog to digital converter digitizes sensor inputs and sends a data ready signal to the processor.

In yet another variant, the processor analyzes sensor data for extracting parameters.

In another variant, the battery can be charged with a solar panel or an electromagnetic induction mechanism.

DETAILED DESCRIPTION OF THE EMBODIMENTS OF THE INVENTION

In a first variant, as generally depicted in FIG. 1, a method for simultaneous monitoring of phase current and spatial parameters of overhead transmission lines with a non-contact magnetic field sensor array, comprising calculating a sensitivity matrix; calculating optimal sensing points; detecting conductor motion; and reconstructing a phase current and sag.

Figure 2:
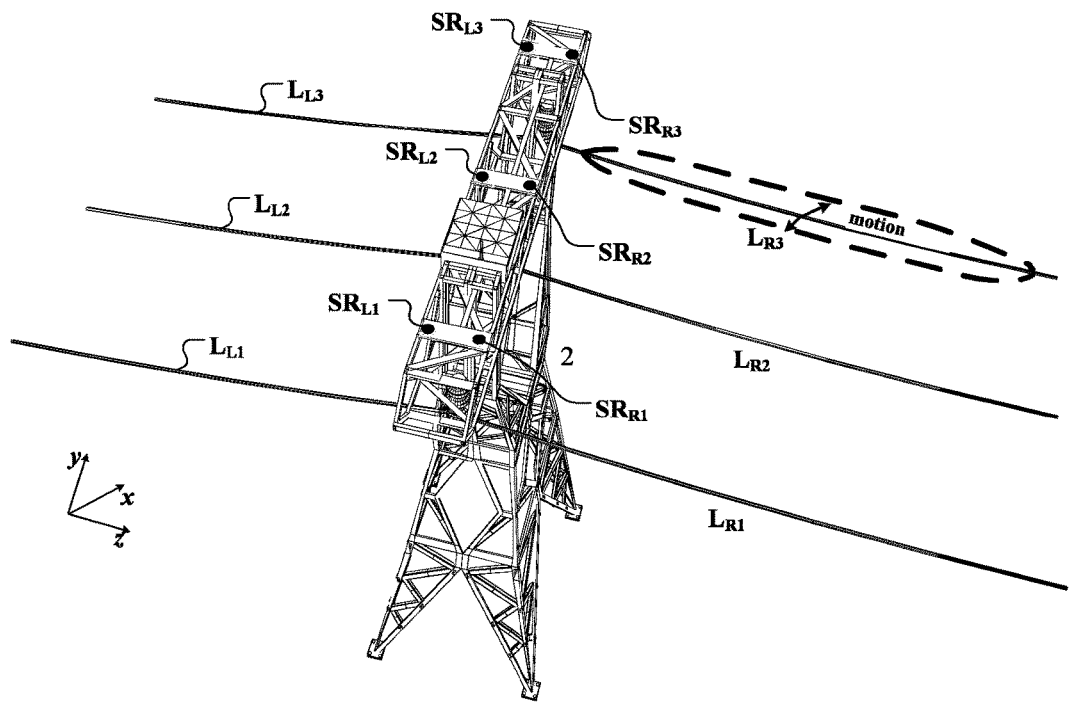
FIG. 2 depicts a magnetic field sensor configuration of the method.

In another variant, as depicted in FIG. 2, magnetic field sensors are arranged on top of a support tower. The magnetic field sensors can be considered as divided into two groups for algorithm implementation on the measured signals, where each group consists of sensors along the same horizontal axis. Calculating the sensitivity matrix comprises measuring one or two components of a magnetic field vector via sensors arranged in two groups, where each group consists of sensors sensitive along one component and equal to number of phase conductors. The sensors are only sensitive along a one axis, and the total number of sensors will be twice in number as of the phase conductors. Calculating a sensitivity parameter governs the relationship for the i-th sensor in a first group of sensors and the j-th phase conductor, wherein i is 1, 2, . . . , N, and j is 1, 2, . . . , N, where N denotes the quantity of phase conductors; wherein the sensitivity matrix of the first group of sensors is $S'_x=(A'_{ij})$ N×N and the sensitivity matrix of the second group of sensors is $S''_x=(A''_{ij})$ N×N; and storing the sensitivity matrices $S'_x$ and $S''_x$ in a memory.

In a further variant, as depicted in FIG. 2, the overhead transmission line consists of three phase conductors, i.e., the number of phase conductors, denoted by N is 3. In FIG. 2 the first group on the left side comprise of the magnetic field sensors, from outside to inside are marked as $L_{L1}$, $L_{L2}$, $L_{L3}$; similarly, on the right in FIG. 2 the second group of magnetic field sensors from outside to inside are marked as conductor $L_{R1}$, $L_{R2}$ and $L_{R3}$. In this example, two magnetic field sensors are placed above each side of the phase conductors which is extending along the neighboring span lengths. These sensors can be considered as part of separate groups as $SR_{L1}$, $SR_{L2}$, $SR_{L3}$ as the first group, whereas the magnetic field sensor $SR_{R1}$, $SR_{R2}$, $SR_{R3}$ for second group.

Figure 3:
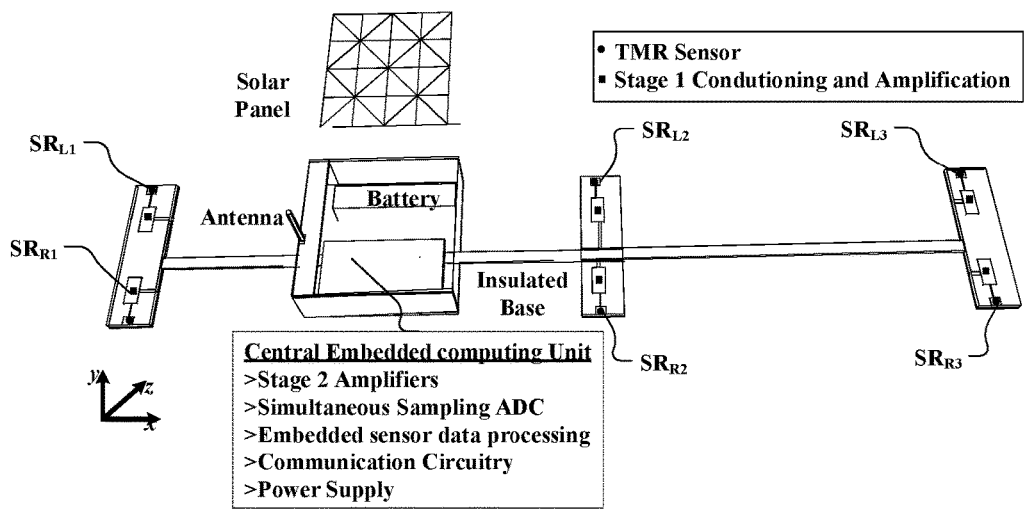
FIG. 3 depicts a hardware configuration of the method.

In yet another variant, as depicted in FIG. 3, the method consists of hardware with on board processing. The relationship between magnetic field, phase current and spatial position of catenary phase conductors is estimated using the Biot-Savart principle. The magnetic field sensing points require to be positioned at points where the error in reconstruction process is minimized. This ensures the convergence of the error within an acceptable of industrial standard set by IEEE Standard 1588, i.e., less than 5%. In order to determine the optimal magnetic field sensing position, it is necessary to deeply understand the source current, as well as the geometric relationship between the sensing point and the phase conductor.

For magnetic field at the sensor point s, which satisfies the Biot-Savart law is denoted as $\vec{B}=\vec{B}_{X_s}+\vec{B}_{Y_s}+\vec{B}_{Z_s}$. The majority of total magnetic flux density generated by the electric current in phase conductors is concentrated along the horizontal component. Also, it varies to a detectable level when phase current or spatial position of conductors is modified. In the present invention for same reason, a magnetic field sensor is a linear one-axis magnetic field sensor mounted to detect the horizontal component. According to Biot-Savart's law, the electric current in a phase conductor positioned at $(x_p,y_p,z_p)$ generates the magnetic field $\vec{B}_{X_s}$ at sensing point s $(x_s,y_s,z_s)$ satisfy $$\vec{B}_{X_{sp}} = \hat{i}_x \frac{\mu_0 I_p}{4\pi} \int_{-\frac{L}{2}}^{\frac{L}{2}} \frac{(z_s-z_p)\sinh\alpha_p z_p - (y_s-y_p)}{|\vec{r}|^3} dz_p \quad (1.1)$$

where $\hat{i}_x$ is the unit vector for the horizontal direction, $\mu_o$ is the permeability of free space, L is the span length, distance vector between sensor to phase conductor is represented as $\vec{r}=(x_s-x_p)\hat{i}_s+(y_s-y_p)\hat{i}_y+(z_s-z_p)\hat{i}_z$, where $\hat{i}_y$ is the vertical unit vector, $\hat{i}_z$ is the unit vector of longitudinal (i.e., phase current transmission) direction. $y_p$ is the conductor height of a sagged conductor and can be represented as $$y_p = y_{tower} + \frac{1}{\alpha_p}(\cosh(\alpha_p z_p)-1), \quad -\frac{L}{2} \leq z_p \leq \frac{L}{2} \quad (1.2)$$

where, $y_{tower}$ is the conductor heighted at tower, and $\alpha_p$ is the mechanical tension parameter between the adjacent span lengths.

Because the sensing point is close to the phase conductor, the earth's magnetic field can be ignored in the calculation. Since the magnetic field generated by each phase conductor is superimposed with each other, the magnetic field intensity measured at each magnetic field sensor is a sum of magnetic field from all the conductors. The field scaled by a sensitivity coefficient. The sensitivity coefficient depends solely on sensor to conductor distance. In this embodiment, where the position of the magnetic field sensors is shown in FIG. 2. For the first set of magnetic field sensors, magnetic field strength generated by the first group with i magnetic field sensors and j phase conductors is:

$$B'_{x_{ij}} = \frac{\mu_0}{4\pi} I_j \int_{-\frac{L}{2}}^{\frac{L}{2}} \frac{(z_i-z_j)\sinh\alpha_j z_j - (y_i-y_j)}{|\vec{r}|^3} dz_j \quad (1.3)$$

To simplify, the sensitivity coefficient can be separated in above equation as follows $$A'_{ij} = \frac{\mu_0}{4\pi} \int_{-\frac{L}{2}}^{\frac{L}{2}} \frac{(z_i - z_j)\sinh\alpha_j z_j - (y_i - y_j)}{|\vec{r}|^3} dz_j \quad (1.4)$$

The sensitivity coefficient of N conductors for M magnetic field sensor in the first set of magnetic field sensors will become N=M as number of conductors is same as number of sensors in first group. The sensitivity matrix can be represented as $$S'_x = (A'_{ij})_{N \times N}$$

$$S'_x = \begin{pmatrix} A'_{11} & \cdots & A'_{1N} \\ \vdots & \ddots & \vdots \\ A'_{N1} & \cdots & A'_{NN} \end{pmatrix}$$

By the same goal, Magnetic field intensity measured by N magnetic field sensors of the first group from $B'_{x_1}$ to $B'_{x_N}$ generated by phase current from $I_1$ to $I_N$, where N is number of current carrying conductors. This relationship takes form of $$\begin{bmatrix} B'_{x_1} \\ \vdots \\ B'_{x_N} \end{bmatrix} = \begin{pmatrix} A_{11} & \cdots & A_{1N} \\ \vdots & \ddots & \vdots \\ A_{N1} & \cdots & A_{NN} \end{pmatrix} * \begin{bmatrix} I_1 \\ \vdots \\ I_N \end{bmatrix} \quad (1.5)$$

It can be generalized as:

$$B'_x = S'_x I$$

Among them:

$$I = \begin{bmatrix} I_1 \\ \vdots \\ I_N \end{bmatrix},$$

$$B'_x = \begin{bmatrix} B'_{x_1} \\ \vdots \\ B'_{x_N} \end{bmatrix}$$

The mechanical tension parameters for each of the phase conductors are known at installation of monitoring system, using the same initial parameters to calculate the sensitivity matrix $S'_x$ according to the Equation 1.4.

For the duration when sensitivity matrix remains unchanged i.e. spatial position parameters of each conductor remain unchanged (no variation in sag or conductor motion). The measured magnetic field from $B'_{x_N}$ sensors of the first group is used to reconstruct the phase current as follows $$I = S'_x{}^{-1} B'_x \quad (1.5)$$

Similarly, according to the above method, the sensitivity matrix $S''_x$ of second group of magnetic field sensors can be obtained. Since, the phase current remains same for both sensor groups, therefore the reconstruction results can be evaluated to determine any change in sensitivity matrices. These matrices alter once the spatial position of any of the phase conductor is modified. By the same effect, the invention provides a method for estimation of electric current and spatial position of phase conductors by inverse reconstruction and iterative comparison.

Inverse phase current reconstruction is prone to errors. For the method to provide adequate results, it is vital to place the sensors at points where the error in reconstruction with Equation 1.5 is minimized. Therefore, in the present embodiment, a magnetic field sensor placement position optimization method is also provided. According to the method, the horizontal and vertical coordinates of N magnetic field sensors $(x_s, y_s)$ for both groups of sensors are adjusted $(x_s + \Delta x_s, y_s + \Delta y_s)$ to find a condition number of the sensitivity matrix for positions where this number is minimized preferable close to unity, using the equations $$|S'_x|_2 |S'_x{}^{-1}|_2 \approx 1$$

$$|S''_x|_2 |S''_x{}^{-1}|_2 \approx 1$$

The magnetic field sensor location optimization program is executed before installation of the monitoring system. The selection of sensor placement points for different tower configurations is based upon this analogy. At the end, the sensitivity matrices for the points where condition number is minimized are placed in memory.

Wind Induced Conductor Motion Detection and Estimation Program

Figure 4:
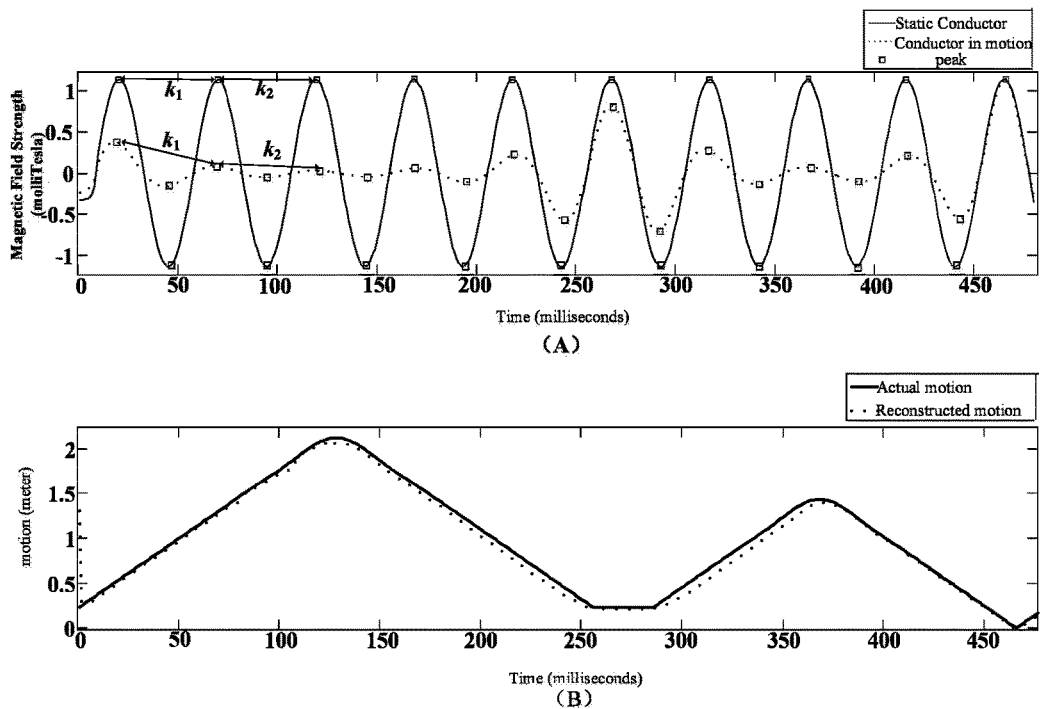
FIG. 4A depicts a graph of static conductor and moving conductor data based on magnetic field strength of the method.
FIG. 4B depicts a graph of reconstructed motion and actual motion of the method.

Overhead high voltage transmission lines are commonly encountered with wind induced conductor oscillations. This effect can be viewed as rotation of sagged phase conductor suspended between end points attached on tower during a certain time period. Conductor motion frequency refers to the time to complete one rotation around the mean position. FIG. 4 shows the field strength of one phase conductor during a time interval of 500 milliseconds, FIG. 4A presents the comparison of magnetic field intensity of a static conductor with a conductor in motion. Here, a displacement of phase conductor away from the mean position varies the magnetic field strength during each cycle and vice versa. On the other hand, a change in sag changes the magnetic field strength for all the samples retrieved during an observation window.

In the invention, the conductor displacement is first distinguished from variation of sag scenario. This is achieved by processing magnetic field data during a time interval of t seconds. Illustrated in FIG. 4A where the measured magnetic field at peak points $k_p$ from each of the sensor during adjacent cycles (p=1, . . . , p) exceeds a threshold implies conductor motion. For accuracy, results from a number of cycles can be summed up as follow $$\sum_{p=1}^{P} k_p > Thershold, p = 1, 2, \ldots, P$$

k where, P is the number of adjacent cycles within the interval of t seconds. In FIG. 4A, in order to simplify the graph surface, the variation rates of first and second adjacent cycles ($k_1$ and $k_2$) are depicted.

Often wind and other factors lead to the occurrence of oscillation of overhead transmission lines which displace the sagged conductor periodically forming motion trajectory as shown in FIG. 2 (for simplicity, the diagram only indicate motion in conductor $L_{R3}$). The oscillation frequencies of each of the phase conductor can be related to the time to complete one period by the phase conductor from the mean position to maximum displacement point. The oscillation path of each phase conductor is different. Therefore, for a phase conductor in motion during a time interval of t seconds, the coordinates are rotated in the x-y plane as:

$$x^r_p(t)=x_p(t_o)\cos\theta_p+y_p(t_o)\sin\theta_p \quad (2.1)$$

$$y^r_p(t)=-x_p(t_o)\sin\theta_p+y_p(t_o)\cos\theta_p \quad (2.2)$$

For the phase conductors in motion, the magnetic field strength changes with time, it increases when the phase conductor is at a point near the magnetic field sensor and vice versa. For calculation of such a field strength, Equation (2.1) and (2.2) are replaced in (1.1) as $$\vec{B}_{X_{sp}}(t) = \hat{1}_x \frac{\mu_0 I_p}{4\pi} \int_{-\frac{L}{2}}^{\frac{L}{2}} \left[ \frac{(z_s - z_p)\sinh\alpha_p z_p - (y_s - y^r_p(t))}{|(x_s - x^r_p(t)) + (y_s - y^r_p(t)) + (z_s - z_p)|^3} \right] dz_p \quad (2.3)$$

Here, the magnetic field intensity $\vec{B}_{X_{sp}}(t)$ at sensing point s depends upon the rotation angle and mechanical tension parameter $\alpha_p$. The influence of the wind force on each phase conductor is different in the real environment. The oscillation characteristics (oscillation frequency, amplitude, rotation direction and angle) of each phase conductor can be extracted from measured magnetic field strength at sensing points.

In this embodiment, the monitoring system triggers calculation program of all these parameters once a conductor motion is detected. The oscillation frequency of the j phase conductor is calculated from the magnetic field signal obtained from the magnetic field sensor $B'_{x_j}$ closest to conductor. Once, the phase conductor displacement reaches the peak value, the magnetic field strength is the smallest. On the contrary, the displacement of the phase conductor reaches 0, the magnetic field magnitude is the largest. Therefore, it equates to the reciprocal of the interval between adjacent maximum energy and minimum energy.

Similarly, the trajectory can be retrieved by calculation of magnetic field by an iterative increase in Equation 2.1 and Equation 2.2. The coordinates of the phase conductors in the rotated x-y plane are obtained by updating $x_j^r \leftarrow x_j^r(\theta_j+\Delta\theta)$, $y_j^r \leftarrow y_j^r(\theta_j+\Delta\theta)$. Finally, at time t, according to the Equation 2.3, where s-i, p-j the algorithm gets the magnetic field strength generated by the phase conductor i at each magnetic field sensor. Measured magnetic field strength $B'_{x_i}$, $B''_{x_i}$ is compared with calculated field $B'_{x,calculated}(x_j^r,y_j^r)$, $B''_{x,calculated}(x_j^r,y_j^r)$. Once the comparison is successful, the displacement of each phase conductor is reconstructed according to the rotation angle of each phase conductor. It should be noted that the comparison here means that the difference between the two magnetic field strengths is less than the set threshold.

In this example, as shown in FIG. 4B, when the phase conductor is in motion, the displacement obtained according to the reconstruction is almost equal to the real displacement, which validates the reconstruction method. The same process continues for the next time interval until the conductor comes to rest.

Phase Current and Sag Reconstruction

Figure 5:
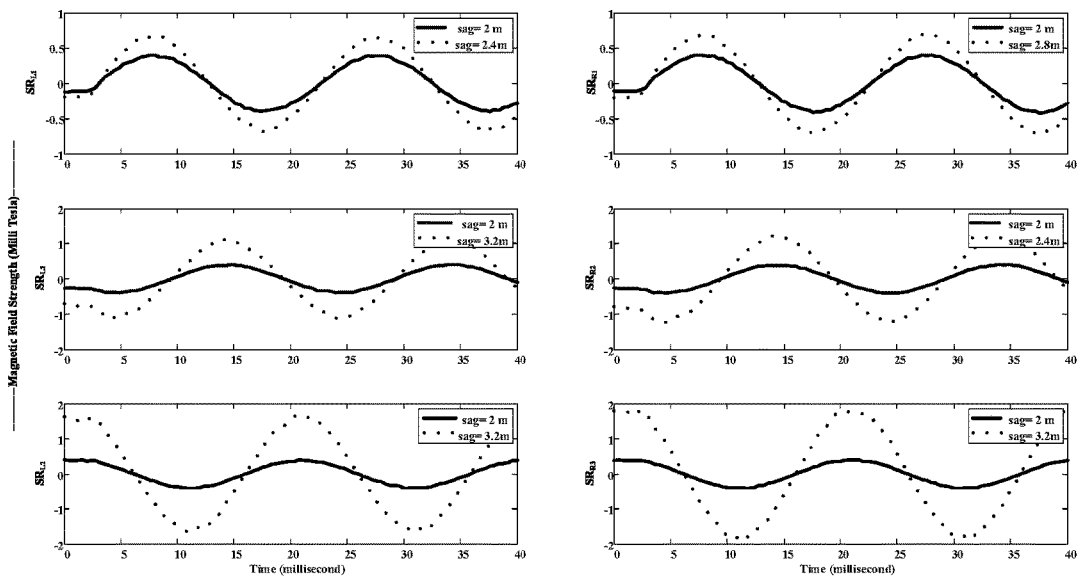
FIG. 5 depicts graphs of magnetic field strength in different sag conditions of the method.

With the passage of time and heating of phase conductors, the mechanical tension parameter of the phase conductors has a tendency to increase which in turn increases the conductor elongation (sag), therefore the magnetic field intensity calculated from the sensitivity matrix of the one in memory is different from the measured values, as shown in FIG. 5. Such a change can be detected by a comparison between calculated and measured magnetic field values only when the conductors are not in motion. First, according to Equation 1, the magnetic field strength from the first group of magnetic field sensors is obtained for sensor 1 $B'_{x_1}$ to sensor N $B'_{x_N}$. Then, the last stored sensitivity matrix for the same group is obtained from memory $S'_x$ to reconstruct the phase current $I_1$ to $I_N$.

To verify, the reconstructed phase current values are multiplied with $S''_x$ of the other sensor group. If the comparison returns a false, new sag parameters are obtained from a look up table, as shown in Table 1, to update the sensitivity matrix. The process is repeated and if correct, new sensitivity matrices and position of new sag parameters in look-up table are stored in memory. The resultant phase current and sag parameters represent the corresponding line conditions.

In this embodiment, the sag table and the reconstruction contrast are shown in table 1.

TABLE 1

| Span Length | 1 | | | 2 | | |
|---|---|---|---|---|---|---|
| Phase conductor Caption in FIG. 2 | 1 ($L_{L1}$) | 2 ($L_{L2}$) | 3 ($L_{L3}$) | 1 ($L_{R1}$) | 2 ($L_{R2}$) | 3 ($L_{R3}$) |
| Phase conductor based on mechanical tension parameter in cache | 0 m | 0 m | 0 m | 0 m | 0 m | 0 m |
| | 0 m | 0 m | 0 m | 0 m | 0 m | 0.1 m |
| | • | • | • | • | • | • |
| Arc sag table | 0 m | 0 m | 0 m | 0 m | 0 m | 3.9 m |
| $sag = \frac{1}{\alpha_j}\left(\cosh\left(\alpha_j \frac{L}{2}\right) - 1\right)$ | 0 m | 0 m | 0 m | 0 m | 0 m | 4.0 m |
| | 0 m | 0 m | 0 m | 0 m | 0.1 m | 0 m |
| | 0 m | 0 m | 0 m | 0 m | 0.1 m | 0.1 m |
| | • | • | • | • | • | • |
| | 0 m | 0 m | 0 m | 0 m | 0.1 m | 3.9 m |
| | 0 m | 0 m | 0 m | 0 m | 0.1 m | 4.0 m |
| | ... | ... | ... | ... | ... | ... |
| | 4.0 m | 4.0 m | 4.0 m | 4.0 m | 3.9 m | 0 m |
| | 4.0 m | 4.0 m | 4.0 m | 4.0 m | 3.9 m | 0.1 m |
| | • | • | • | • | • | • |
| | 4.0 m | 4.0 m | 4.0 m | 4.0 m | 3.9 m | 3.9 m |
| | 4.0 m | 4.0 m | 4.0 m | 4.0 m | 3.9 m | 4.0 m |
| | 4.0 m | 4.0 m | 4.0 m | 4.0 m | 4.0 m | 0 m |
| | 4.0 m | 4.0 m | 4.0 m | 4.0 m | 4.0 m | 0.1 m |
| | • | • | • | • | • | • |
| | 4.0 m | 4.0 m | 4.0 m | 4.0 m | 4.0 m | 3.9 m |
| | 4.0 m | 4.0 m | 4.0 m | 4.0 m | 4.0 m | 4.0 m |
| Actual sag | 2.4 m | 3.2 m | 3.2 m | 2.8 m | 2.4 m | 3.2 m |
| Reconstructed arc | 2.4 m | 3.2 m | 3.2 m | 2.8 m | 2.4 m | 3.2 m |

From Table 1, we can see that as long as a sag data is found in the sag table, the reconstructed phase current satisfies $B''_x \equiv S''_x I$ The obtained sag data is the reconstruction of the sag. From table 1, the reconstructed sag is consistent with the actual sag.

TABLE 2

| Signal noise ratio of magnetic field sensor | $SR_{L1}$ | $SR_{L2}$ | $SR_{L3}$ | $SR_{R1}$ | $SR_{R2}$ | $SR_{R3}$ |
|---|---|---|---|---|---|---|
| | 21.575 | 20.7282 | 20.8983 | 20.7599 | 20.7987 | 20.7154 |
| 2.5 s Magnetic field | $B_{p1}$ | $B_{p2}$ | $B_{p3}$ | $B_{p4}$ | $B_{p5}$ | $B_{p6}$ |

TABLE 2-continued

| sensor average magnetic field strength (Tesla) | 0.0004 | 0.0007 | 0.001 | 0.0004 | 0.0008 | 0.0012 |
|---|---|---|---|---|---|---|

| | Phase Current 1 | Phase Current 2 | Phase Current 3 |
|---|---|---|---|
| Actual phase current (ampere) | 845.32 | −389.82 | −455.5 |
| Reconstructed phase current (ampere) | 847.12 | −390.65 | −456.48 |

Table 2 is the comparison between the reconstructed phase current and the actual phase current. From Table 2, we can see that the reconstructed phase current is less than 0.3% of the actual phase current.

After phase current and sag reconstruction are completed, the execution returns to step two and continue monitoring of the next time interval t.

Although the above description of the invention embodiment of the invention to describe, understand the technical personnel to facilitate the technical field, but it should be clear that the invention is not limited to the scope of the specific implementation methods, common technical personnel in the technical field of view, as long as the change in the attached claim defined and determined the invention of the spirit and scope of these changes is obviously, all using the invention concept inventions are protected.

What is claimed is:

1. A method for simultaneous monitoring of phase current and spatial parameters of overhead transmission lines comprising one or more phase conductors by estimation of phase current, conductor sag and wind induced galloping with a non-contact magnetic field sensor array, comprising:
   providing a first group and a second group of magnetic field sensors;
   calculating a first sensitivity matrix and a second sensitivity matrix for the first group of magnetic field sensors and for the second group of magnetic field sensors, respectively, each coefficient of each sensitivity matrix relating a respective one of the magnetic field sensors to a respective of the phase conductors, and being dependent on the conductor sag parameters of the phase conductors and positions of the respective one of the magnetic field sensors relative to respective of the phase conductors;
   calculating optimal sensing points for sensor placement, wherein a determinant of the first sensitivity matrix multiplied by a determinant of an inverse of the first sensitivity matrix is a first condition number close to or equal to unity and a determinant of the second sensitivity matrix multiplied by a determinant of an inverse of the second sensitivity matrix is a second condition number close to or equal to unity;
   placing the sensors at the calculated optimal points;
   measuring a magnetic field at each sensor of the first and second group when the phase conductors are at rest and constructing a first magnetic field vector populated by magnetic field measurements by the magnetic field sensors of the first group and a second magnetic field vector populated by magnetic field measurements by the magnetic field sensors of the second group;
   multiplying the inverse of the first sensitivity matrix by the first magnetic field vector to obtain a first phase current vector, wherein errors in the estimation of the first phase current vector are decreased by the first condition number being close to or equal to unity;
   multiplying the first phase current vector by the second sensitivity matrix to obtain a calculated magnetic field vector, wherein errors in the estimation of the calculated magnetic field vector are decreased by the second condition number being close to or equal to unity;
   comparing the calculated magnetic field vector to the second magnetic field vector and updating conductor sag parameters in the first and second sensitivity matrices until a difference between the calculated magnetic field vector and the second magnetic field vector is less than a desired threshold;
   when the difference between the calculated magnetic field vector and the second magnetic field vector is less than the desired threshold, recording the updated conductor sag parameters and calculating a final phase current vector; and
   measuring a magnetic field at each sensor of the first and second group when the phase conductors move and calculating motion characteristics of the phase conductors comprising oscillation frequency, amplitude, rotation direction, angle by processing magnetic field variations over time sensed by the sensors.

2. The method of claim 1, wherein:
   calculating the first sensitivity matrix and the second sensitivity matrix comprises reading initial or last saved sag parameters of each of the phase conductor in a look up table;
   multiplying the inverse of the first sensitivity matrix by the first magnetic field vector comprises performing the following operation, where I is the first phase current vector:

$$I = S_x'^{-1} B_x'$$

where, $$I = \begin{bmatrix} I_1 \\ \vdots \\ I_N \end{bmatrix}, B_x' = \begin{bmatrix} B_{x_1}' \\ \vdots \\ B_{x_N}' \end{bmatrix}$$

where I is the first phase current vector, $B_x'$ is the first magnetic field vector, and $S_x'^{-1}$ is the inverse of the first sensitivity matrix;
   comparing the calculated magnetic field vector to the second magnetic field vector comprises;
   verifying the first phase current utilizing the second sensitivity matrix from a look up table and data from a second group of sensors;
   verifying an equality, $$B_x'' = S_x'' I$$

holds true by checking if the difference between both sides of equation is less than the desired threshold value
where, $$B''_x = \begin{bmatrix} B''_{x_1} \\ \vdots \\ B''_{x_N} \end{bmatrix}$$

$B''_x$ is the second magnetic field vector, and $S''_x$ is the second sensitivity matrix;

if the equality holds true, updating the first and second sensitivity matrices $S'_x$ and $S''_x$, communicating the sag parameters and phase current reconstruction results;

if the equality does not hold true:
  i) jumping to a next value of the sag parameters from the look up table and updating the sensitivity matrix;
  ii) utilizing a new combination from the look up table of sag values to update the sensitivity matrix coefficients for the first and second sensitivity matrices;
  iii) repeating the steps of multiplying the inverse of the first sensitivity matrix by the first magnetic field vector and of comparing the calculated magnetic field vector to the second magnetic field vector.

3. The method of claim 1, wherein each group of magnetic field sensors comprises sensors sensitive along a respective component of the magnetic field created by the phase current and each group comprises a number of sensors equal to a number of the phase conductors.

4. The method of claim 3, wherein the sensors of both the first and the second groups are only sensitive along a single axis, and the total number of sensors is twice in number as of the phase conductors.

5. The method of claim 4, wherein the first sensitivity matrix governs a relationship for the i-th sensor in the first group of sensors and the j-th phase conductor, wherein i is 1, 2, ..., N, and j is 1, 2, ..., N, where N denotes a quantity of phase conductors;
wherein the first sensitivity matrix of the first group of sensors is $S'_x = (A'_{ij}) N \times N$ and the second sensitivity matrix of the second group of sensors is $S''_x = A''_{ij} N \times N$;
wherein the calculating of the first sensitivity matrix and of the second sensitivity matrix comprises storing the sensitivity matrices $S'_x$ and $S''_x$ in a memory.

6. The method of claim 3, wherein calculating motion characteristics of the phase conductors comprising oscillation frequency, amplitude, rotation direction, angle by processing magnetic field variations over time sensed by the sensors comprises:
  i) in a time interval t for measured magnetic field intensity by each of the sensors, if a sum of variations for any of the magnetic field sensor measurements during adjacent cycles exceeds a second threshold, flagging conductor motion;
  ii) retrieving a motion characteristic;
  iii) repeating steps i) and ii) for a next time interval, until for the sum of the variations is less than the second threshold.

7. The method of claim 6, wherein conductor motion is flagged if the magnetic field at the sensors closest to phase conductors shows a strong variation at adjacent cycle peak points.

8. The method of claim 3, wherein the oscillation frequency of each phase conductor is a reciprocal of a time period between a magnetic field intensity measured for a maximum energy cycle to a minimum energy cycle obtained by the closest sensor.

9. The method of claim 3, wherein a trajectory of each phase conductor is measured by calculating a magnetic field strength for each phase conductor, calculating the coordinates of each phase conductor using $(x^r_j \leftarrow x^r_j(\theta_j + \Delta\theta_j), y^r_j \leftarrow y^r_j(\theta_j + \Delta\theta_j))$, and comparing the measured field strength to a calculated field $(B'_{x,calculated}(x^r_j, y^r_j) \equiv B''_{x,calculated}(x^r_j, y^r_j))$.

* * * * *